United States Patent [19]

Demnianiuk

[11] 4,381,131
[45] Apr. 26, 1983

[54] LEVERED SYSTEM CONNECTOR FOR AN INTEGRATED CIRCUIT PACKAGE

[75] Inventor: Eugene F. Demnianiuk, San Diego, Calif.

[73] Assignee: Burroughs Corporation, Detroit, Mich.

[21] Appl. No.: 260,268

[22] Filed: May 4, 1981

[51] Int. Cl.³ .......................................... H01R 23/72
[52] U.S. Cl. ............................. 339/75 M; 339/17 CF; 339/91 R
[58] Field of Search ............. 339/17 CF, 75 M, 91 R, 339/176 M; 174/52 FP; 220/324

[56] References Cited

U.S. PATENT DOCUMENTS

| | | | |
|---|---|---|---|
| 1,635,189 | 7/1927 | McClure | 220/324 |
| 1,946,872 | 2/1934 | Muhleisen | 220/324 |
| 2,857,576 | 10/1958 | Ueckert | 339/91 R |
| 3,054,023 | 9/1962 | Blecker et al. | 339/91 R |
| 3,391,383 | 7/1968 | Antes | 339/17 CF |
| 3,575,685 | 4/1971 | Gley | 339/75 M |
| 3,771,109 | 11/1973 | Bruckner et al. | 339/17 CF |
| 3,953,101 | 4/1976 | Palecek | 339/17 CF |
| 4,204,722 | 5/1980 | Yasui et al. | 339/17 CF |

FOREIGN PATENT DOCUMENTS

| | | | |
|---|---|---|---|
| 36410 | 6/1930 | France | 220/324 |
| 253613 | 3/1948 | Switzerland | 220/324 |

*Primary Examiner*—John McQuade
*Attorney, Agent, or Firm*—Charles J. Fassbender; J. Ronald Richbourg; Kevin R. Peterson

[57] ABSTRACT

The disclosed system connector is comprised of a frame that is adapted to receive an integrated circuit package such that electrical conductors in the frame align with corresponding electrical conductors in the integrated circuit package. A pivotal member, connected to the frame, replaceably secures the integrated circuit package to the frame and presses the aligned electrical conductors together. This pivotal member has a latching portion that follows tracks in the frame to press and latch the aligned electrical conductors together, and has a lever portion that pivots the latching portion along the tracks with a mechanical advantage.

6 Claims, 4 Drawing Figures

LEVERED SYSTEM CONNECTOR FOR AN INTEGRATED CIRCUIT PACKAGE

BACKGROUND OF THE INVENTION

This invention relates to the art of packaging integrated circuit chips; and more particularly to connectors for replaceably securing integrated circuit packages to a printed circuit board.

Integrated circuit packages comprise an integrated circuit chip that has been encapsulated in a protective material such as plastic or ceramic. These packages can be either leaded or leadless. In the former, electrical conductors extend from the encapsulant as a means for sending signals to and receiving signals from the chip; whereas in the latter, that means is provided by electrical pads that lie flush with the encapsulant.

In the prior art, these packages have been connected to printed circuit boards in both an irreplaceable and a replaceable fashion. Typically, an irreplaceable connection is made by soldering the package directly to the printed circuit board; whereas a replaceable connection is made by soldering a connector to the printed circuit board and inserting the integrated circuit package into the connector in a solderless fashion.

Electrical conductors are provided in the socket to make electrical connections between the printed circuit board and the leads or pads in the integrated circuit package. However, to make those connections reliable, the electrical conductors in the socket and the corresponding leads or pads in the package must be pressed together with a certain minimal amount of force.

In the past, a typical integrated circuit package had only 16 leads or pads, and so the total compressive force that was required to make reliable contacts between a connector and that package was only five pounds. However, with the advent of large scale integrated circuits, the number of transistors that can be fabricated on a single chip has passed 100,000. But to fully utilize this capability, more leads or pads are required to input and output signals to the chip. Depending on the irregularity with which these transistors are interconnected, over 100 input/output signals may be required.

But as the number of leads or pads on an integrated circuit package increases, the minimum compressive force that is required between the package and the conductors in the connector also increases. For example, a 128 lead package would typically require a minimum force of forty-two pounds. But connectors generally are quite small (e.g. 2.75 cm×2.75 cm). And so the forty-two pound compressive force must be supplied by one's fingers, which is difficult to do with prior art connectors.

Accordingly, a primary object of this invention is to provide an improved connector for use with an integrated circuit package.

Another object of the invention is to provide a connector that latches to and compresses the leads/pads of an integrated circuit package with a mechanical advantage of greater than one.

BRIEF SUMMARY OF THE INVENTION

These and other objects are accomplished in accordance with the invention by a system connector comprising a frame, a plurality of electrical conductors in the frame, and a pivotal member connected to a track in a frame. The frame is adapted to receive the integrated circuit package such that its electrical conductors are aligned with corresponding electrical conductors in the integrated circuit package. To replaceably secure the integrated circuit package to the frame and to press the aligned electrical conductors together, the pivotal member includes a latching portion that pivots to follow the track in the frame and thereby press and latch the integrated circuit package to the frame, and includes a lever portion that pivots the latching portion with a mechanical advantage.

BRIEF DESCRIPTION OF THE DRAWINGS

Various features and advantages of the invention are described in the following Detailed Description in conjunction with four accompanying drawings wherein.

DETAILED DESCRIPTION OF THE INVENTION

Figure 1:
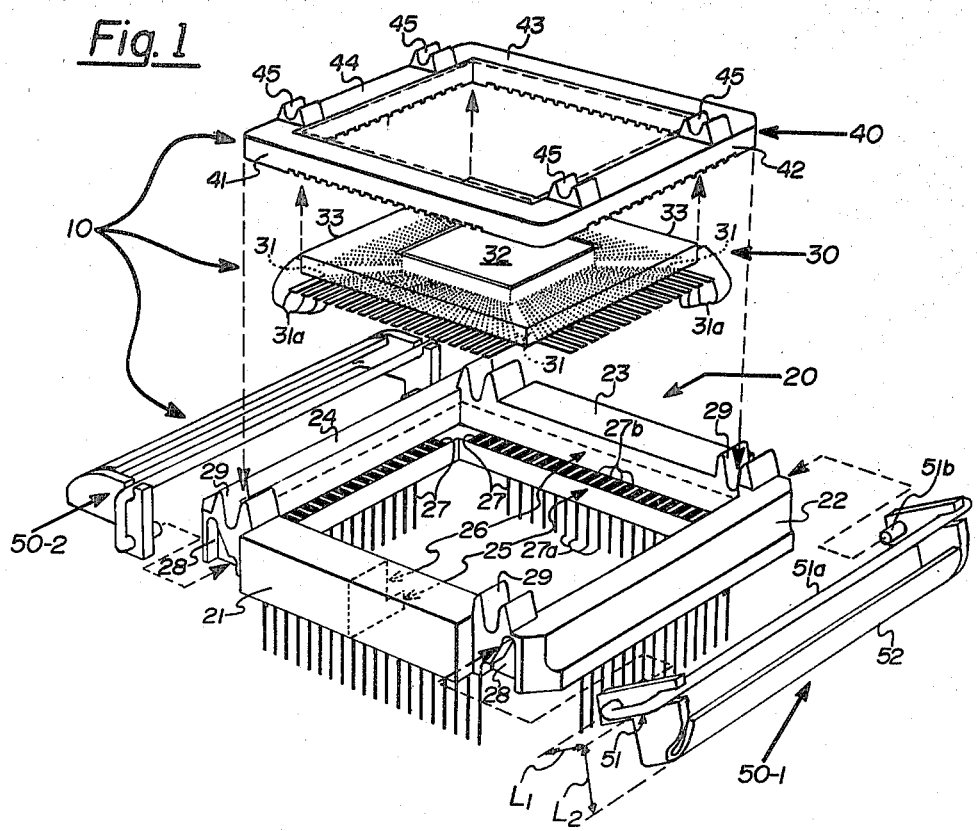
FIG. 1 is an exploded pictorial view of one embodiment of the invention.

Referring now to FIG. 1, one preferred embodiment of a system connector 10 which is constructed in accordance with the invention will be described in detail. This particular system connector includes a rectangular frame 20 having sides 21, 22, 23, and 24. These sides have L-shaped cross-sections which define two concentric openings 25 and 26. Opening 25 coincides with the outer perimeter of an integrated circuit package 30; and opening 26 coincides with the outer perimeter of the leads 31 that extend from that package.

Included in each of the sides 21 through 24 are a plurality of electrical conductors 27. One portion 27a of each of these conductors protrudes from the bottom of frame 20. They provide the means for making electrical contact with an electronic circuit (not shown). Another portion 27b of each of the conductors 27 makes electrical contact with corresponding conductors 31 in the integrated circuit package 30.

Leads 31 in the integrated circuit package 30 connect to an integrated circuit chip 32. Those leads 31 are held in place by an encapsulant 33 such as plastic or ceramic. When package 30 is inserted into opening 25, those portions 31a of the leads 31 that extend from encapsulant 33 are aligned with and lie on top of conductor portions 27b in frame 20.

A lid 40 is also included in system connector 10. Lid 40 has four sides 41, 42, 43, and 44. Those sides have an inner perimeter which coincides with opening 25 of frame 20; while the outer perimeter of lid 40 coincides with opening 26 of frame 20. Thus, lid 40 is shaped to lie on top of the lead portions 31a and press them against the corresponding conductor portions 27b in frame 20.

Also included in system connector 10 are a pair of identical pivotal members 50-1 and 50-2. Each pivotal member includes a latch portion 51 and a lever portion 52. These pivotal members 50-1 and 50-2 respectively connect to sides 22 and 24 of frame 20 as illustrated in FIG. 1.

Each latch portion 51 is C-shaped having a center 51a and having ends 51b. Ends 51b fit into respective tracks 28 on frame sides 22 and 24; whereas center 51a lies in fulcrums 45 on lid 40. Those fulcrums are aligned with guide slots 29 in frame 20.

Consider now the operation of the above-described system connector. To begin, integrated circuit package 30 is placed in frame 20 such that encapsulant 33 lies within opening 25 and lead portions 31a are in contact with corresponding conductor portions 27b. Lid 40 is also placed in opening 26 such that lid sides 41 through 44 lie on top of integrated circuit package lead portions 31a.

Thereafter, the center of the latch portion 51 of pivotal member 50-1 is placed in fulcrums 45 on lid side 42. Similarly, the center of the latch portion 51 of pivotal member 50-2 is placed in fulcrums 45 of lid side 44. From that position, a force is manually applied to the lever portions 52 of the two pivotal members to press and lock components 20, 30, and 40 together.

In response to that force, pivotal member 50-1 and 50-2 pivot in fulcrums 45 such that their end portions 51b follow tracks 28 in frame 20. This movement presses components 20, 30, and 40 together; and it presses the corresponding conductor portions 31a and 27b against each other. This pressing action is illustrated in detail in FIG. 2.

Figure 2:
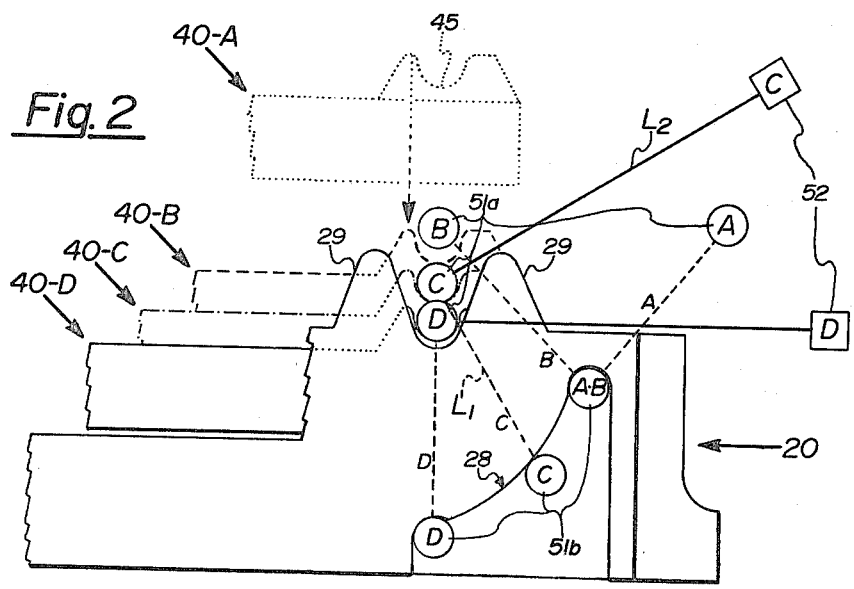
FIG. 2 is a diagram illustrating the operation of the FIG. 1 embodiment.

In FIG. 2, letters A, B, D, and D indicate four sequential positions of either pivotal member. Initially, the pivotal members are in position A; then they move to position B; then to position C; and then to position D. Reference numerals 40-A through 40-D indicate corresponding positions of lid 40.

With the pivotal members in position A, center 51a of latch portion 51 lies outside of the frame's concentric openings 25 and 26; and thus, lid 40 can readily be placed into the frame (i.e.-it can move from position 40-A to position 40-B). Thereafter, each pivotal member pivots on its ends 51b from position A to position B; and in position B, center 51a of each lever portion lies transverse to a row of leads 31a and lies on fulcrums 45.

Subsequently, in moving from position B to position C and to position D, the latch portion pivots on its center 51a. At the same time, ends 51b follow tracks 28 and center 51a moves vertically in the guide slots 29. As a result, lid 40 moves from position 40-B to position 40-C and then to position 40-D.

Preferably, the length L1 from center 51a to end 51b is less than the length L2 of lever portion 52. Under those conditions, a mechanical advantage of greater than one is achieved. This is desirable because as lid 40 moves from position 40-B to position 40-D, the compression of conductors 31a and 27b produces a repelling force. And as the number of leads on package 30 increase, this repelling force becomes larger and thus more difficult to overcome.

Consider, for example, an integrated circuit package having 128 leads. To make reliable electrical contacts between those leads and conductors 27 in frame 20, each lead and corresponding conductor must be compressed with a minimum force of approximately 150 grams. Thus, a total force of approximately forty-two pounds minimum is required to compress all 128 leads. Now in the present invention, this can be achieved by applying a substantially smaller force to lever portions 42 when length L1 is made less than length L2.

Also, since the compressing force is not manually applied directly to the 32, various types of chip damage are avoided. For example, in the case where a heat sink is attached to chip 32, the danger of someone pushing on the heat sink and breaking it off is completely eliminated. Further, the conductor portions 27a which extend from the bottom of frame 20 are generally quite sharp and can cause puncture wounds to one's fingers if they are pushed directly against them. But in the above-disclosed embodiment, one need only push on lever portions 51a while holding onto frame sides 21 and 23.

It is also important to note that in the present invention, each center portion 51a of the pivotal members lies transverse to a corresponding row of electrical conductors. Consequently, the compressive force that is supplied by each pivotal member in position D is distributed evenly across its corresponding row of conductors. This further improves reliability. Also there is essentially no warping or stressing of lid 40 which might otherwise occur if it were held in place at only one point by a tab.

It is to be understood, of course, that all of the above features and advantages of the FIG. 1 embodiment may be achieved without regard to the sizes of the various components. But one specific example of some suitable dimensions is as follows. Integrated circuit package 30 could have a perimeter of 2.5 cm×2.5 cm around encapsulant 33. Lid 40 would then have an inner perimeter of slightly more than 2.5 cm×2.5 cm; and a suitable outer perimeter of lid 40 would be 3.5 cm×3.5 cm. Frame 20 would then have an opening 25 that is slightly larger than 2.5 cm×2.5 cm and an opening 26 that is slightly larger than 3.5 cm×3.5 cm. A suitable outer perimeter for frame 20 would be 5 cm×5 cm.

Also, it is to be understood that various materials can be utilized to construct the above-described components of connector 10. Again as a specific example, frame 20 and lid 40 may be constructed of plastic; while moveable member 50-1 and 50-2 may be constructed of metal.

Figure 3:
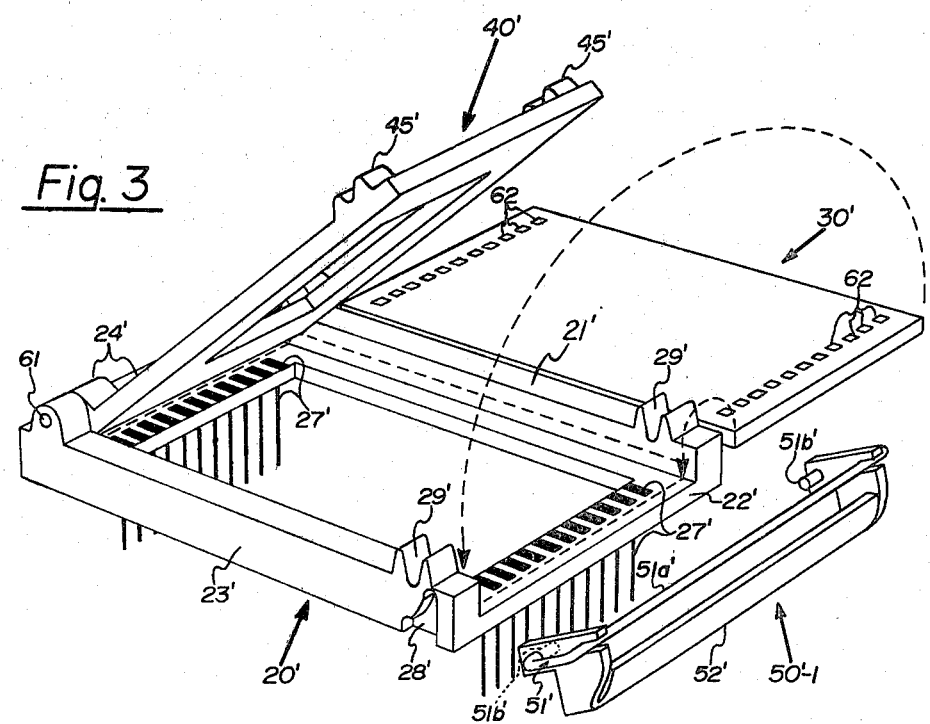
FIG. 3 is an exploded pictorial view of another embodiment of the invention.

Turning now to FIG. 3, a second embodiment of the invention will be described in detail. This embodiment is somewhat similar to the embodiment of FIGS. 1 and 2, and like components are identified by primed like reference numerals. For example, illustrated in FIG. 3 is a frame 20', an integrated circuit package 30', a lid 40', and a pivotal member 50'-1.

One different feature of the FIG. 3 embodiment (as compared to the FIG. 1 embodiment) is that lid 40' is hinged at one end to frame 20'. This is indicated by reference numeral 61. Consequently, only one pivotal member 50'-1 is needed. Pivotal member 50'-1 works in conjunction with fulcrums 45' on lid 40', tracks 28' on frame 20', and guide slots 29' on frame 20' as was described in detail in conjunction with FIG. 2.

Another difference between the FIG. 2 and FIG. 3 embodiments is that in the latter, frame 20' is open on sides 22' and 24'. That is, sides 22' and 24' are rectangular-shaped rather than L-shaped. This enables lid 40' to rotate freely on its hinged end and to open and close freely on its other end.

Also note that the integrated circuit package 30' with which the FIG. 3 embodiment operates is a leadless package. That package includes a plurality of electrical pads 62 as the means for sending and receiving electrical signals to the integrated circuit chip 32'. Pads 62 are in alignment with conductor portions 27b' in frame 20'. And as another variation over the FIG. 1 embodiment, only two rows of pads 62 and corresponding lead portions 27b' are illustrated as existing.

Figure 4:
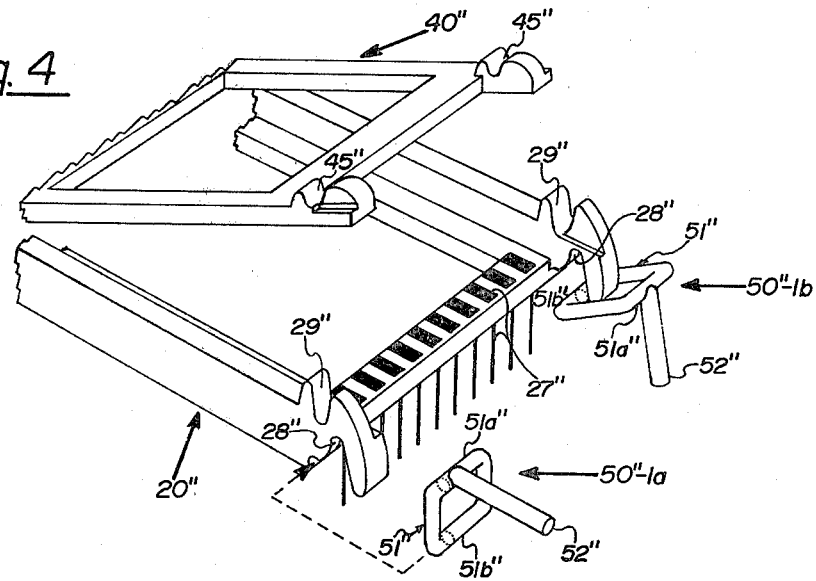
FIG. 4 is a pictorial view of still another embodiment of the invention.

Reference should now be made to FIG. 4 where still another embodiment of the invention is illustrated. This embodiment also has similarities in comparison to the above-described embodiments of FIGS. 1 through 3, and like components are indicated by like reference numerals with a double prime. For example, the FIG. 4 embodiment includes a frame 20", and a hinged lid 40".

One different feature of the FIG. 4 embodiment (as compared to the embodiments of FIG. 1 through 3) is that fulcrums 45" on the sides of lid 40 are cantilevered. Also, the tracks 28" and guide slots 29" in frame 20 are cantilevered. Components 45", 28", and 29" operate in conjunction with two pivotal members 50"-1a and 50"-1b to provide the means for latching frame 20" and lid 40" together.

Each of those pivotal members includes a latch portion 51" having a rectangular opening through which track 29" is inserted as illustrated. Center portion 51a" fits onto a cantilevered fulcrum 45". And portion 51b" follows track 29" when a force is manually applied to the lever portion 52" to thereby lock components 20" and 40" together.

Various preferred embodiments of the invention have now been described in detail. In addition, many changes and modifications can be made to these embodiments without departing from the nature and spirit of the invention. Thus it is to be understood that the invention is not limited to said details but is defined by the appended claims.

What is claimed is:

1. A double-pivot levered system connector for use with an integrated circuit package, said system connector comprising:
   a frame containing a plurality of electrical conductors and a pair of grooved tracks;
   said frame being adapted to receive said integrated circuit package with said electrical conductors being aligned with corresponding electrical conductors in said integrated circuit package;
   a lid which lies on the electrical conductors of said integrated circuit package while they are in alignment with the electrical conductors in said frame;
   a pivotal member having ends that respectively fit into said tracks on said frame;
   said pivotal member having a central portion that moves to contact said lid when said central portion is pivoted in one direction about said ends while said ends stay at a first position in said tracks;
   said tracks being shaped such that when said ends are pivoted about said central portion in another direction opposite to said one direction while said central portion is on said lid at the point where said contact is made, said ends move in said tracks away from said first position to pull said lid and frame together with said aligned conductors lying therebetween;
   said pivotal member further including a lever portion that pivots said ends about said central portion in said another direction with a mechanical advantage.

2. A system connector according to claim 1 wherein said aligned conductors are arranged in a row and the contact point of the central portion of said pivotal member with said lid overlies said row so that said aligned conductors are pressed together with an evenly distributed force as said ends move in said tracks away from said first position.

3. A system connector according to claim 1 wherein said lid is hinged to one portion of said frame, and said tracks in which the ends of said pivotal member move are at an opposite portion of said frame.

4. A system connector according to claim 1 wherein the ends of said pivotal member lie in tracks in one portion of said frame, and wherein another identical pivotal member is included which has ends that lie in tracks at an opposite portion of said frame.

5. A double-pivot levered system connector for use with an integrated circuit package, said system connector comprising:
   a frame containing a plurality of electrical conductors and a pair of cantilevered tracks;
   said frame being adapted to receive said integrated circuit package with said electrical conductors being aligned with corresponding electrical conductors in said integrated circuit package;
   a lid which lies on the electrical conductors of said integrated circuit package while they are in alignment with the electrical conductors in said frame;
   a pair of pivotal members, each of which has an opening through which a respective cantilevered track on said frame extends;
   each pivotal member having a central portion that moves to contact said lid when said central portion is pivoted in one direction about another portion of the member that stays at a first position on said respective track;
   each track being shaped such that when said another portion is pivoted about the central portion in another direction opposite to said one direction while said central portion is on said lid at the point where said contact is made, said another portion moves in said track away from said first position to pull said lid and frame together with said aligned conductors lying therebetween;
   each pivotal member further including a lever portion that pivots said another portion about said central portion in said another direction with a mechanical advantage.

6. A system connector according to claim 5 wherein said lid is hinged to one portion of said frame, and said cantilevered tracks on which said pivotal members move extend from an opposite portion of said frame.

* * * * *